United States Patent
Peng et al.

(10) Patent No.: US 9,818,638 B1
(45) Date of Patent: Nov. 14, 2017

(54) MANUFACTURING METHOD OF SEMICONDUCTOR DEVICE

(71) Applicant: TAIWAN SEMICONDUCTOR MANUFACTURING CO., LTD., Hsinchu (TW)

(72) Inventors: Yu-Yun Peng, Hsinchu (TW); Chung-Chi Ko, Nantou (TW); Shing-Chyang Pan, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/490,233

(22) Filed: Apr. 18, 2017

Related U.S. Application Data

(63) Continuation of application No. 15/204,801, filed on Jul. 7, 2016, now Pat. No. 9,659,811.

(51) Int. Cl.
*H01L 21/4763* (2006.01)
*H01L 21/768* (2006.01)

(52) U.S. Cl.
CPC .. *H01L 21/76807* (2013.01); *H01L 21/76829* (2013.01); *H01L 21/76877* (2013.01)

(58) Field of Classification Search
None
See application file for complete search history.

(56) References Cited

U.S. PATENT DOCUMENTS

| | | | | |
|---|---|---|---|---|
| 7,052,621 | B2 * | 5/2006 | Kumar | H01L 21/0332 216/51 |
| 8,114,769 | B1 * | 2/2012 | Srivastava | H01L 21/31144 257/E21.579 |
| 8,222,160 | B2 * | 7/2012 | Uozumi | H01L 21/02063 257/623 |
| 2003/0044725 | A1 | 3/2003 | Hsue et al. | |
| 2011/0195576 | A1 | 8/2011 | Ko et al. | |
| 2012/0133044 | A1 | 5/2012 | Uozumi | |
| 2014/0273496 | A1 | 9/2014 | Kao et al. | |

OTHER PUBLICATIONS

Notice of Allowance U.S. Appl. No. 15/204,801 dated Jan. 27, 2017.

* cited by examiner

*Primary Examiner* — Bradley K Smith
(74) *Attorney, Agent, or Firm* — McDermott Will & Emery LLP

(57) ABSTRACT

A method of forming a semiconductor device includes forming a low-k dielectric layer over a substrate and forming a first dielectric layer on the low-k dielectric layer. A first metal hard mask layer is formed on the first dielectric layer, and a second dielectric layer is formed on the first metal hard mask layer. A second metal hard mask layer is formed on the second dielectric layer, and a first trench opening is formed in the second metal hard mask layer and the second dielectric layer exposing the first metal hard mask layer. A first via opening is formed in the exposed first metal hard mask layer in the first trench opening, and the first trench opening and first via opening are extended into the low-k dielectric layer to form a first trench and a first via.

20 Claims, 11 Drawing Sheets

MANUFACTURING METHOD OF SEMICONDUCTOR DEVICE

CROSS-REFERENCE TO RELATED APPLICATIONS

This Application is a Continuation Application of U.S. Ser. No. 15/204,801, filed Jul. 7, 2016, the subject matter of which is incorporated herein by reference in its entirety.

TECHNICAL FIELD

The disclosure relates to semiconductor devices and particularly to interconnects and methods for their fabrication.

BACKGROUND

As feature densities in semiconductor devices increase, the widths of the conductive lines, and the spacing between the conductive lines of back-end of line (BEOL) interconnect structures in the semiconductor devices also need to be scaled down. Interconnects are often formed using damascene processes rather than by direct etching. Damascene processes are typically either single or dual damascene, which include forming openings by patterning and etching inter-metal dielectric (IMD) layers and filling the openings with a conductive material. However, there are some challenges in the damascene structure, such as double or triple patterning processes may be used and IMD layers may be exposed to wet chemicals and, therefore, result in damage of the IMD layers and device performance degradation. In particular, porous low-k IMD layers may suffer from solvent penetration into the IMD layer when exposed to wet chemicals. In addition, residuals from the ashing of overlying resist layers during resist layer removal can damage IMD layers. The ashing of overlying resist layers during resist layer removal can also damage IMD layers.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
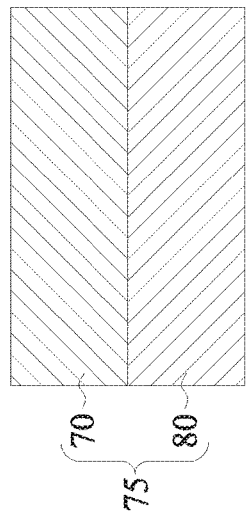
FIGS. 1A-14 show an exemplary process for manufacturing a semiconductor device according to one embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Examples of devices that can benefit from one or more embodiments of the present disclosure are semiconductor devices. In various embodiments, the semiconductor device includes fin field effect transistors (FinFET) and other metal oxide semiconductor field effect transistors (MOSFET). FinFET transistors are field effect transistors formed on fin structures formed over a substrate. In some embodiments, the fin structures are formed in an array. FinFET transistors include P-channel field effect transistors (PFET) and N-channel FET (NFET). Other semiconductor devices may include static random access memory (SRAM) and/or other logic circuits, passive components such as resistors, capacitors, and inductors, and active components such as bipolar transistors, high voltage transistors, high frequency transistors, other memory cells, and combinations thereof. The semiconductor device may include a plurality of semiconductor devices (e.g., transistors), which may be interconnected. It is understood, however, that the application should not be limited to a particular type of device, except as specifically claimed.

The semiconductor devices include interconnect structures that include a plurality of interconnect pattern (line) layers having conductive patterns and interconnecting various features in one portion of the die to other features of the die. The interconnect structures are formed of conductive materials such as metal and the semiconductor devices include several interconnect layers in various embodiments. The interconnect layers are often referred to as "metal 1" or "M1" (designating the lowermost interconnect level), "metal 2", "metal 3", and so on. These designations are well known and used in the art to indicate that the conductive lines interconnect features from various locations in the semiconductor device. In some embodiments, the metal interconnect lines connect an array of FinFET transistors to other arrays or other features.

The interconnect layer patterns in different layers are also coupled to one another through vias that extend vertically between one or several interconnect layers. The interconnect layer patterns are coupled to external features and can represent signal lines, bit lines, word lines, power supply lines, and various input/output connections in some embodiments. In some embodiments of the disclosure, each of the interconnect structures is formed by a damascene process, in which a layer of inter-metal dielectric (IMD) material is deposited, trenches and vias are formed and filled with conductive material (e.g., copper or aluminum or various alloys) and the surface is planarized by chemical mechanical polishing (CMP), although other patterning techniques are used in other embodiments.

Figure 1C:
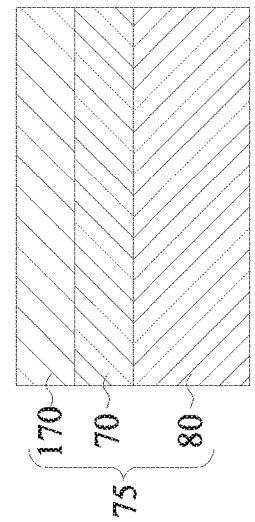
Figure 1A:
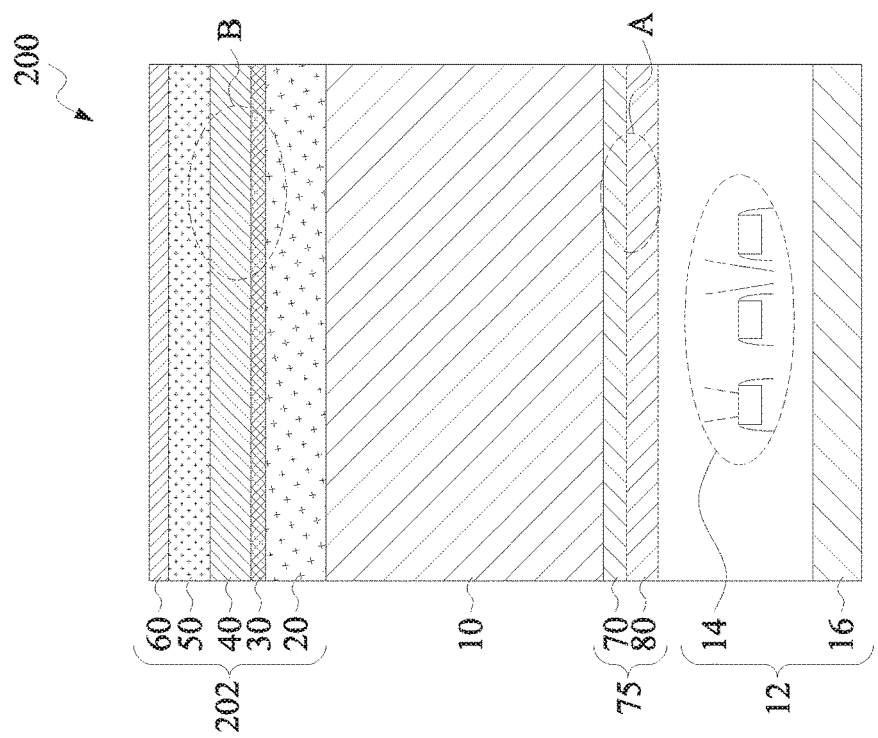

In FIG. 1A, a double metal hard mask structure 202 is formed over a substrate 12. The substrate 12 can include one or more electronic devices 14, including passive components such as resistors, capacitors, and inductors, and active components such as a PFET, an NFET, a MOSFET, complementary metal-oxide semiconductor (CMOS) transistors, such as a FinFET transistor, bipolar transistors, high voltage transistors, high frequency transistors, other memory cells, and combinations thereof on a semiconductor substrate 16.

In one embodiment, the semiconductor substrate includes a single crystalline semiconductor layer on at least its surface portion. The semiconductor substrate may comprise a single crystalline semiconductor material such as, but not limited to Si, Ge, SiGe, GaAs, InSb, GaP, GaSb, InAlAs, InGaAs, GaSbP, GaAsSb, and InP. In a certain embodiment, the semiconductor substrate is made of Si.

The semiconductor substrate may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate, in a P-well structure, in an N-well structure, in a dual-well structure, or using a raised structure. The substrate may include various doped regions configured for a P-channel Field Effect Transistor (PFET) device and/or an N-channel Field Effect Transistor (NFET) device.

As shown in FIG. 1A, a method of forming a semiconductor device 200 according to some embodiments of the present disclosure includes forming an etch stop layer 75 over a substrate 12. In some embodiments, the etch stop layer 75 includes a first etch stop layer 70 and second etch stop layer 80, as shown in FIG. 1B, which is a detail view of area A. Both the first etch stop layer 70 and second etch stop layer 80 are formed of dielectric materials, such as a silicon oxide ($SiO_x$), a silicon nitride ($SiN_x$), $SiC_xN_y$, and a silicon oxycarbide ($SiC_xO_y$) where the etch stop layer 70 is different from the second etch stop layer 80. The etch stop layers are deposited by a low pressure chemical vapor deposition (LPCVD), a plasma-enhanced chemical vapor deposition (PECVD), a plasma-enhanced atomic layer deposition (PEALD), or a thermal atomic layer deposition (ALD) operation. The combination of first etch stop layer 70 and second etch stop layer 80 has a thickness of about 5 angstroms to about 250 angstroms.

In some embodiments, the etch stop layer 75 includes a metal oxide or metal nitride selected from an aluminum oxide ($AlO_x$), an aluminum nitride ($AlN_x$), an aluminum oxynitride ($AlO_xN_y$), a titanium oxide ($TiO_x$), a titanium oxynitride ($TiO_xN_y$), a zinc oxide ($ZnO_x$), and a manganese oxide ($MnO_x$), and the metal oxide or nitride etch stop layers are deposited by PECVD, PEALD, and thermal ALD or physical vapor deposition (PVD) and sputtering operations to a thickness of about 3 to about 100 angstroms.

In some embodiments, the etch stop layer 75 includes a plurality of metal oxide or metal nitride etch stop layers. For example, in some embodiments, the etch stop layer 75, includes a first etch stop layer 70 and second etch stop layer 80, as shown in FIG. 1B. The first etch stop layer 70 includes a single metal oxide, nitride, or oxynitride, and the second etch stop layer 80 includes a dielectric material, such as $SiO_x$, $SiN_x$, $SiC_xN_y$, and $SiC_xO_y$. In some embodiments, the etch stop layer 75 includes three or more etch stop layers, as shown in FIG. 1C. The first and second etch stop layers 70, 80 may be formed of the same materials as the bilayer etch stop layer 75 illustrated in FIG. 1B. 1B including a metal oxide or nitride as etch stop layer 70. A third etch stop layer 170 is disposed above the first etch stop layer 70. The third etch stop layer 170 includes $SiC_xO_y$ or $SiO_x$ and is formed through any of a variety of deposition techniques, including, low-pressure chemical vapor deposition (LPCVD), atmospheric-pressure chemical vapor deposition (APCVD), PECVD, PEALD, PVD, and sputtering. The combination of the first etch stop layer 70 and the third etch stop layer 170 has a thickness of about 5 to about 100 angstroms. The second etch stop layer 80 is formed to a thickness of about 25 to about 100 angstroms, in certain embodiments.

An inter-metal dielectric (IMD) layer 10 is subsequently formed over the etch stop layer 75. In some embodiments, the IMD layer includes a low-k dielectric material having a dielectric constant ranging from about 2.3 to 2.7. The low-k dielectric material may include dense or porous low-k dielectric material, deposited by PECVD to a thickness of about 300 to about 2000 angstroms.

In certain embodiments, the IMD layer 10 is a porous low-k material, wherein two precursors are used. One of the precursors is alkoxysilane-based group forming the major Si—O bonding, while the other precursor is porogen material. A thermal or ultraviolet post-curing is applied to the low-k IMD layer 10 providing a low-k layer having a porosity of about 16% to about 40%. In other embodiments, the IMD layer 10 is a dense low-k layer formed from a single alkoxysilane-based precursor material. The dense low-k layer 10 has a porosity of less than 25% and a dielectric constant greater than about 2.7. The dense low-k layer can be optionally post-cured by a thermal or ultraviolet radiation exposure to improve mechanical strength.

A first dielectric layer 20 is subsequently formed on the IMD layer 10. The first dielectric layer 20 may include a silicon oxide ($SiO_x$), a silicon oxycarbide ($SiC_xO_y$), a carbon-doped silicon oxide (SiOH:C), and a titanium silicon oxide (TiSiO) deposited by conventional thermal CVD, PECVD, PVD, PEALD, or thermal ALD process to a thickness of about 100 angstroms to about 500 angstroms. In some embodiments, the first dielectric layer 20 contains a plurality of titanium oxide and silicon oxide layers to create etch selectivity between the metal hard mask layer and the IMD layer 10.

Figure 1F:
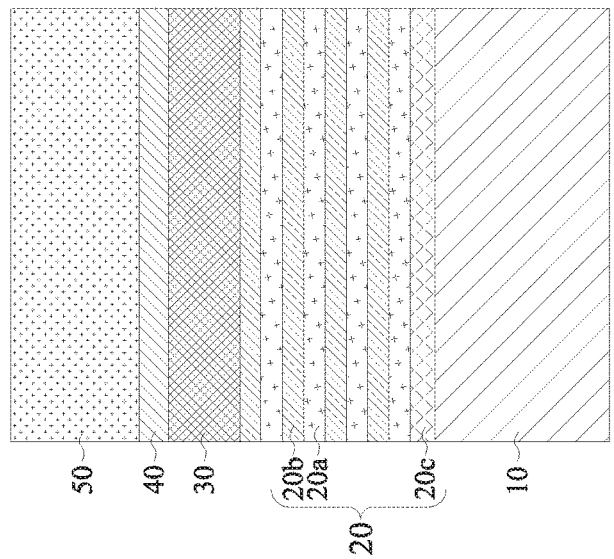
Figure 1E:
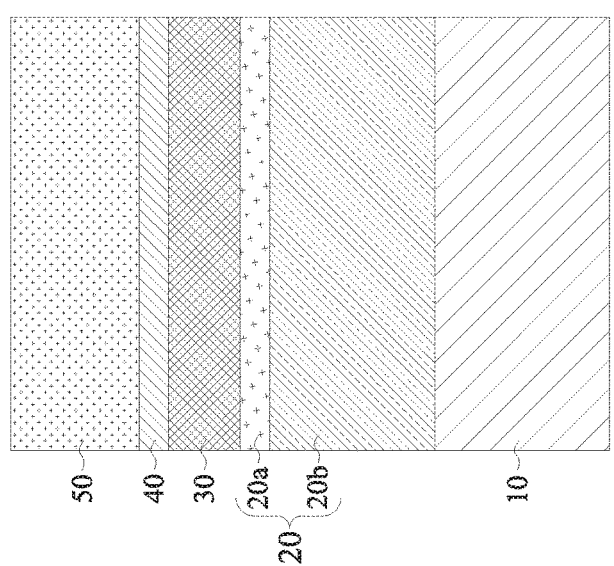
Figure 1D:
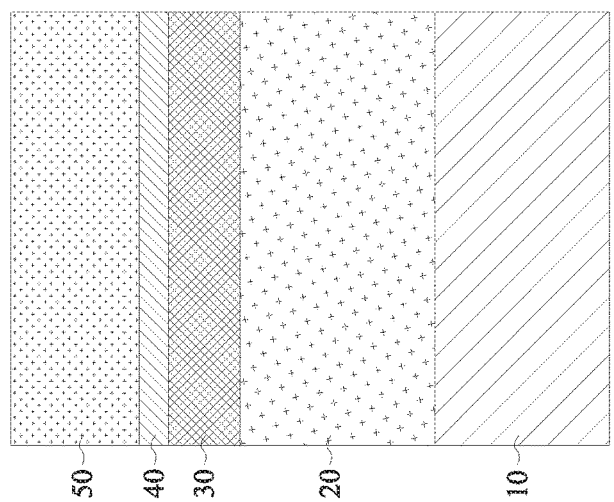

FIGS. 1D-1F are detailed views of area B, illustrating various embodiments of the disclosure having different first dielectric layer 20 arrangements. In some embodiments, the first dielectric layer 20 is a uniform layer, such as a single layer of $Ti_xSi_yO$, where $0.25 \le x \le 1$ and $0.25 \le y \le 1$, as shown in FIG. 1D. In some embodiments, the refractive index of the first dielectric layer ranges from about 1.47 to about 2.6.

In other embodiments, the first dielectric layer 20 has a bilayer arrangement having a first first dielectric layer 20a and a second first dielectric layer 20b, as shown in FIG. 1E. The first first dielectric layer 20a includes $Ti_xSi_yO$, where $x/y<1$ and the second first dielectric 20b includes where $1 \le x \le 2$ in some embodiments. Both the first first dielectric layer 20a and the second first dielectric layer 20b can be individually deposited by PVD, PECVD, thermal ALD, or PEALD. The ratio of thicknesses of the first first dielectric layer 20a to the second first dielectric layer 20b (20a/20b) is about 0.1 to about 0.5 in some embodiments.

In other embodiments, the first dielectric layer 20 has a multilayer arrangement, having a third first dielectric layer 20c as a bottom layer including $SiO_{2-x}$, where $0<x<0.1$; and a plurality of alternating repeating layers of first first dielectric layers 20a and second first dielectric layers 20b. The bottom third first dielectric layer 20c isolates the first first dielectric layer 20a from the low-k layer 10. In certain embodiments, the first first dielectric layers 20a include $TiO_{2-x}$, where $0<x<0.1$; and the second first dielectric layers 20b include $SiO_{2-x}$, where $0<x<0.1$. The first first dielectric layer 20a and the second first dielectric layer 20b are formed by thermal ALD or PEALD in some embodiments. Thus, in some embodiments, the repeat unit of the multilayer first dielectric layer 20 is $[TiO_{2-x}]_m/[SiO_{2-x}]_n$, where m and n are the ALD cycle numbers, and both m and n are greater than 1. In some embodiments more than three pairs of first first dielectric layers 20a and second first dielectric layers 20b are formed. The refractive index of the multilayer first dielectric layer is about 1.47 to about 2.6 in certain embodiments.

A first metal hard mask layer 30 is subsequently formed over the first dielectric layer 20. The first metal hard mask layer 30 may include a metal, such as a Ti-based or Al-based metal, or metal nitrides and metal oxides, such as a Ti-based or Al-based nitride, or Ti-based or Al-based oxide deposited by a LPCVD, PECVD, PEALD, thermal ALD, or PVD process. In certain embodiments, the metal hard mask layer 30 is doped with Si, C, or transition metal, such as Ni, Co, Mn, or V to modify the etch selectivity of the metal hard mask layer.

A second dielectric layer 40 is subsequently formed on the first metal hard mask layer 30 in certain embodiments. The second dielectric layer 40 may include a silicon oxide ($SiO_x$), a silicon oxycarbide ($SiC_xO_y$), a carbon-doped silicon oxide (SiOH:C), and a single uniform, bilayer or multilayer $TiSi_xO_y$ deposited by a conventional LPCVD, PECVD, PEALD, or thermal ALD process to a thickness of about 100 angstroms to about 500 angstroms. In certain embodiments, the second dielectric layer 40 is formed of the same material and/or same thickness as the first dielectric layer 20. In other embodiments, the material forming the second dielectric layer 40 and/or the thickness of the second dielectric layer 40 are different from the material and thickness of the first dielectric layer 20.

A second metal hard mask layer 50 is subsequently formed over the second dielectric layer 40. The second metal hard mask layer 50 may include a Ti-based or Al-based metal, Ti-based or Al-based nitride, or Ti-based or Al-based oxide deposited by LPCVD, PECVD, PEALD, thermal ALD, or PVD process. In certain embodiments, the second metal hard mask layer 50 is doped with Si, C, or transition metal, such as Ni, Co, Mn, or V to modify the etch selectivity of the second metal hard mask layer 50. In certain embodiments, the second metal hard mask layer 50 is formed of the same material or same thickness as the first metal hard mask layer 30. In other embodiments, the material forming the second metal hard mask layer 50 and the thickness of the second metal hard mask layer 50 are different from the material and thickness of the first metal hard mask layer 30.

A third dielectric layer 60 is optionally formed on the second metal hard mask layer 50 in certain embodiments. The third dielectric layer 60 may include a silicon oxide ($SiO_x$), a silicon oxycarbide ($SiC_xO_y$), and a carbon-doped silicon oxide (SiOH:C) deposited by conventional PECVD, PEALD, or thermal ALD process to a thickness of about 100 angstroms to about 500 angstroms. In certain embodiments, the third dielectric layer 60 is formed of the same material and/or same thickness as the first dielectric layer 20 and second dielectric layer 40. In other embodiments, the material forming the third dielectric layer 60 and the thickness of the third dielectric layer 60 are different from the material and thickness of the first and second dielectric layers 20, 40. The third dielectric layer 60 inhibits oxidation of the second metal hard mask layer 50. If oxidation of the second metal hard mask layer 50 is not a concern, i.e.—the second metal hard mask layer 50 is exposed to an inert or reducing atmosphere during subsequent processing, the third dielectric layer 60 can be eliminated.

The combined first dielectric layer 20, first metal hard mask layer 30, second dielectric layer 40, second metal hard mask layer 50, and optional third dielectric layer 60 form a double metal hard mask structure 202. In some embodiments, the patterned second metal hard mask layer 50 acts a trench hard mask during subsequent processing, and the patterned first metal hard mask layer 30 acts as both a via and trench hard mask during subsequent processing.

In a certain embodiment, a double metal hard mask structure 202 contains: $SiO_x$ as the third dielectric layer 60, SiOH:C as the first and second dielectric layers 20, 40, $TiO_x$ as the first metal hard mask layer 30, and TiN as the second metal hard mask layer 50. The double metal hard mask structure 202 overlies an ultraviolet-cured porous low-k material as the IMD layer 10, $SiC_xO_y$ as the first etch stop layer 70 and $SiC_xN_y$ as the second etch stop layer 80. This double metal hard mask structure 202 is suitable for a fabrication method including subsequent dry etching operations.

In another embodiment, a double metal hard mask structure 202 contains: $SiO_x$ as the third dielectric layer 60, SiOH:C as the first and second dielectric layers 20, 40, $TiO_x$ as the first metal hard mask layer 30, and TiN as the second metal hard mask layer 50. The double metal hard mask structure 202 overlies an ultraviolet-cured porous low-k material as the IMD layer 10, $AlO_x$ as the first etch stop layer 70, $SiC_xN_y$ as the second etch stop layer 80. This double metal hard mask structure 202 is suitable for a fabrication method including subsequent dry and wet etching operations.

In another embodiment, the double metal hard mask structure 202 contains: $SiO_x$, where $1<x<2$ as the first dielectric layer 20; SiOH:C as the second dielectric layer 40, and third dielectric layer 60. The first metal hard mask layer 30 is formed of $TiO_x$, where $1<x<2$; and the second metal hard mask layer 50 is formed of $TiN_x$, where $0.4<x<1$.

Figure 2:
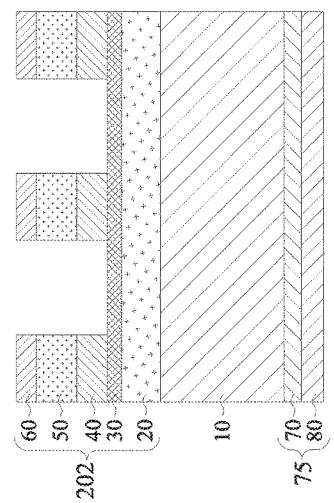

As shown in FIG. 2, a first trench opening 110 and a second trench opening 112 are formed in the third dielectric layer 60, second metal hard mask layer 50, and second dielectric layer 40 exposing the first metal hard mask layer 30. In certain embodiments, the first trench opening 110 and a second trench opening 112 are formed by photolithography and etching operations, including a dry etching operation. In FIG. 2 and subsequent figures the substrate 12 is not shown to simplify the disclosure.

Figure 3:
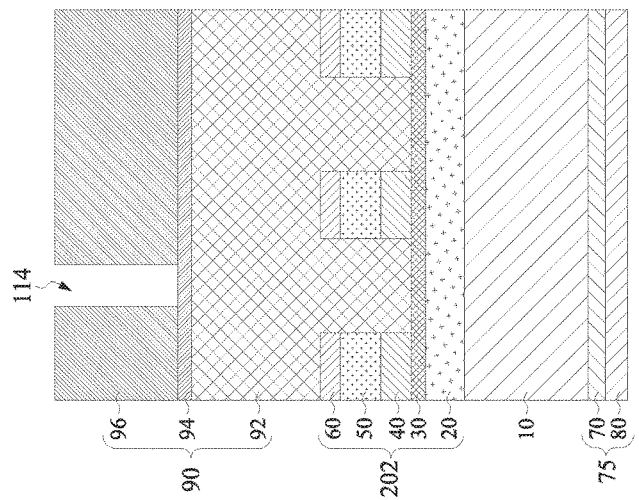

A first resist layer 90 is formed over the optional third dielectric layer 60, second metal hard mask layer 50, and the first and second trench openings 110, 112, as shown in FIG. 3. In some embodiments, the first resist layer 90 is a trilayer resist including a planarizing bottom layer 92, an anti-reflective middle layer 94, and a photoresist upper layer 96. In certain embodiments, the thickness of the photoresist upper layer 96 ranges from about 500 angstroms to about 1500 angstroms. In certain embodiments, the thickness of middle layer 94 ranges from about 200 angstroms to about 500 angstroms. In certain embodiments, the thickness of the bottom layer is about 500 angstroms to about 3000 angstroms.

Figure 4:
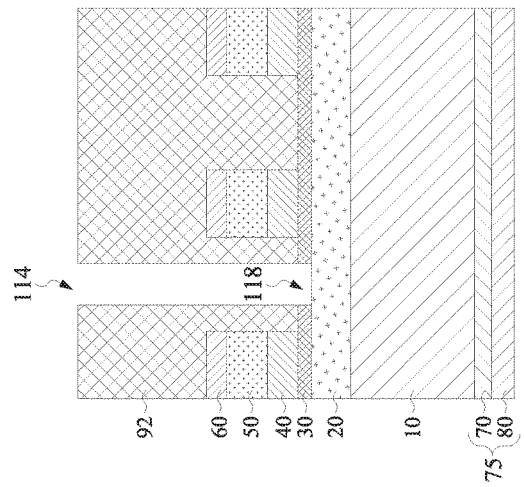

A first resist layer opening 114 is formed in the photoresist upper layer 96 of the first resist layer 90 by photolithographic operations. The first resist layer opening 114 is extended through the middle layer 94 and the bottom layer 92 using suitable anisotropic etching operations, and the photoresist is removed by a suitable stripping or ashing operation, as shown in FIG. 4.

In certain embodiments, the anti-reflective middle layer 94 includes a silicon-containing anti-reflective material. In certain embodiments, the resist layer 90 further includes a dielectric anti-reflective coating (DARC) as part of a four-layer resist.

Figure 5:
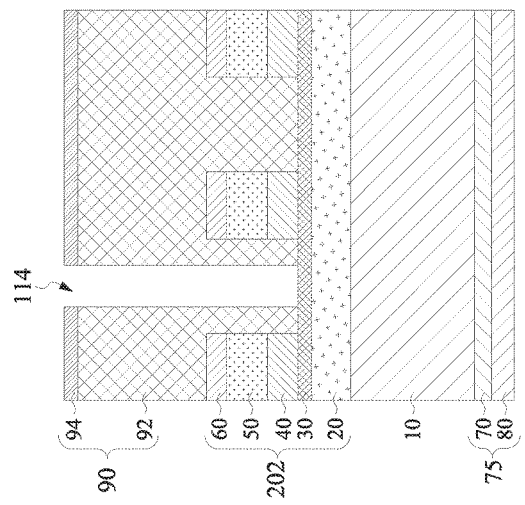
Figure 6:
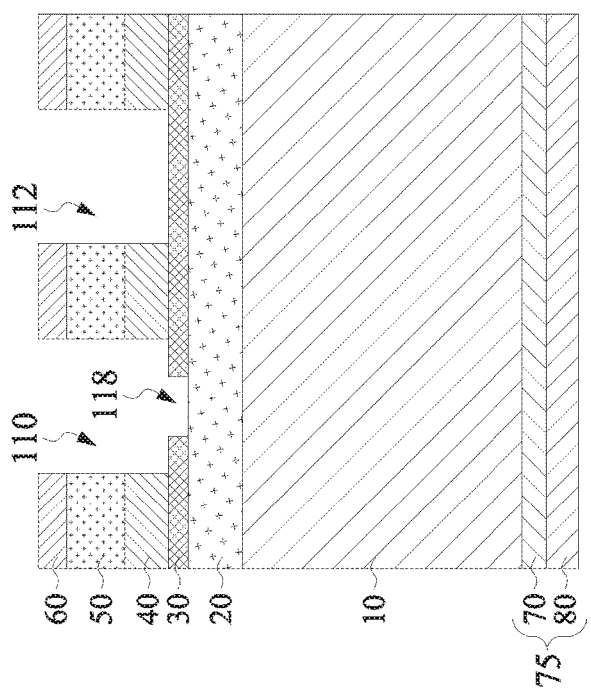

As shown in FIG. 5, the portion of the first metal hard mask layer 30 exposed by the first resist opening 114 is removed and the middle resist layer 94 is removed. The first metal hard mask layer 30 and the middle resist layer 94 can be removed by a suitable etching operation. For example, a plasma dry etch using $Cl_2$ or $BCl_3$-based chemistries is used to selectively etch the first metal hard mask layer 30, in some embodiments. The etching forms a first via opening 118 in the first metal hard mask layer 30 exposing the first dielectric layer 20. The resist bottom layer 92 is removed by a suitable etching, stripping, or ashing operation, as shown in FIG. 6.

Figure 7:
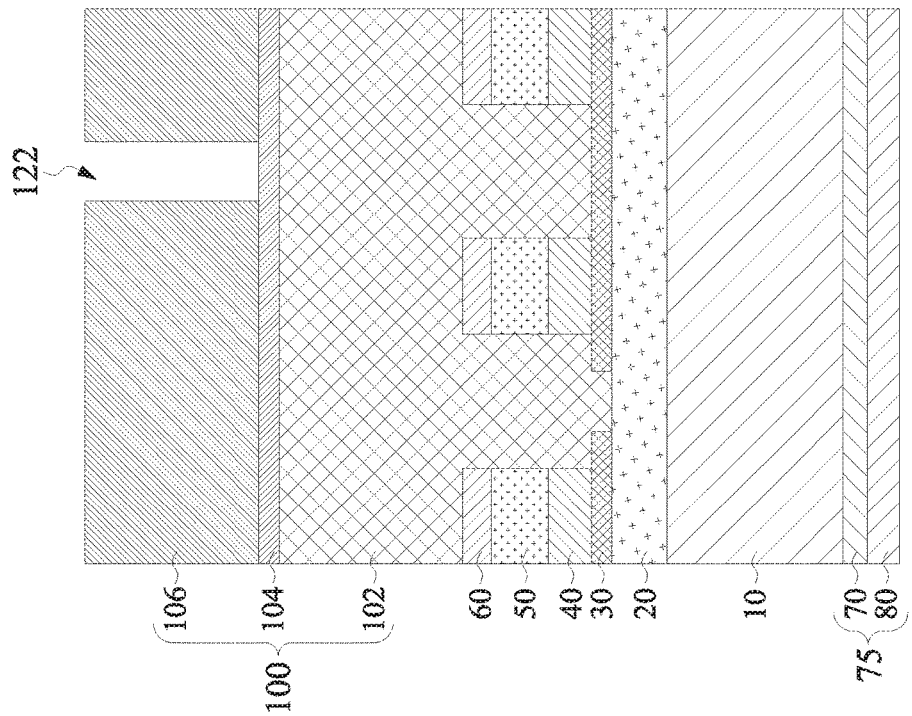
Figure 8:
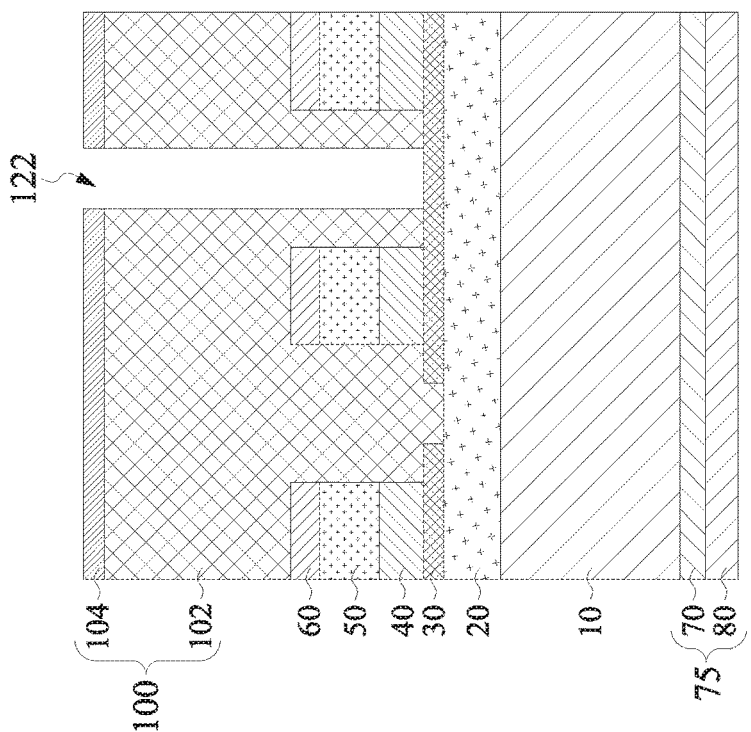

In some embodiments, a second resist layer 100 is formed over the optional third dielectric layer 60, second metal hard mask layer 50, and the first and second trench openings 110, 112, as shown in FIG. 7. In some embodiments, the second resist layer 100 is a trilayer resist including a planarizing bottom layer 102, an anti-reflective middle layer 104, and a photoresist upper layer 106. A second resist layer opening 122 is formed in the photoresist upper layer 106 of the first resist layer 100 by photolithographic operations. The second resist layer opening 122 is extended through middle layer 104 and the bottom layer 102 using suitable anisotropic etching operations, and the photoresist is removed by a suitable stripping or ashing operation, as shown in FIG. 8.

In certain embodiments, the resist layer 100 further includes a dielectric anti-reflective coating (DARC) as part of a four-layer resist to improve pattern formation.

Figure 9:
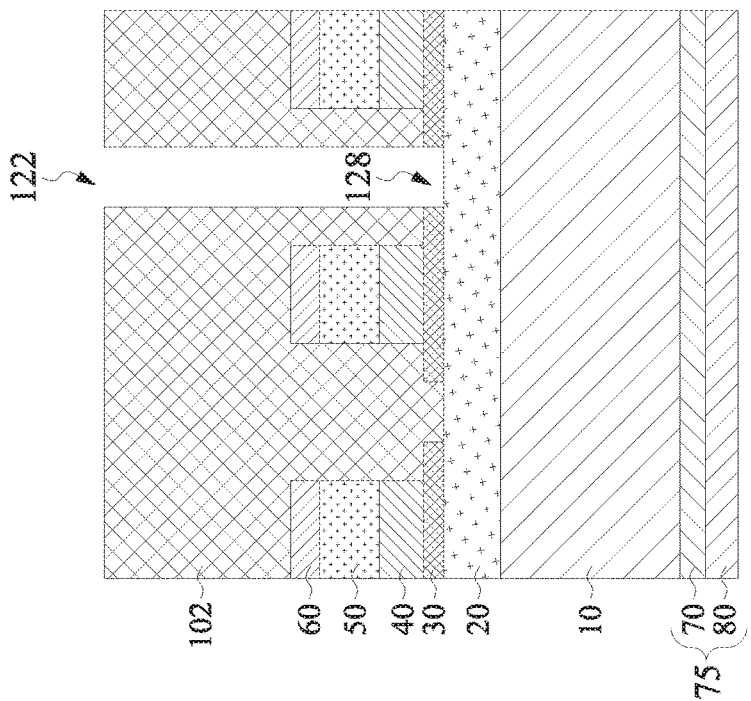
Figure 10:
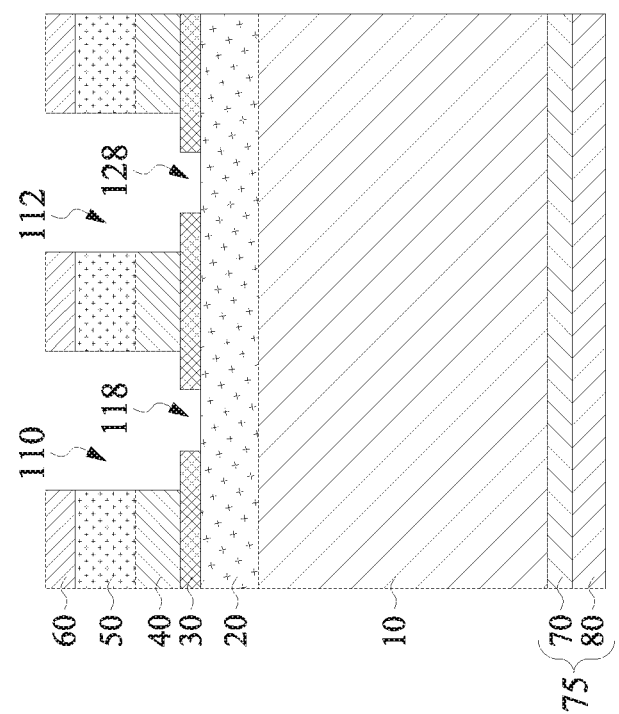

As shown in FIG. 9, the portion of the first metal hard mask layer 30 exposed by the second resist opening 122 is removed and the middle resist layer 104 is removed. The first metal hard mask layer 30 and the middle resist layer 104 can be removed by a suitable etching operation. For example, a plasma dry etch using $Cl_2$ or $BCl_3$-based chemistries is used to selectively etch the first metal hard mask layer 30, in some embodiments. The etching forms a second via opening 128 in the first metal hard mask layer 30 exposing the first dielectric layer 20. The resist bottom layer 102 is removed by a suitable etching, stripping, or ashing operation, as shown in FIG. 10. In certain embodiments, the second via opening 128 is formed before the first via opening 118.

The structures and operations of FIGS. 7-10 are substantially the same as those of FIGS. 3-6 in some embodiments.

In some embodiments, the bottom resist layer 92, 102 of the trilayer resist 90, 100 is an organic material. The organic material may include a plurality of monomers or polymers that are not cross-linked. Generally, the bottom resist layer may contain a material that is patternable and/or have a composition tuned to provide anti-reflection properties. Exemplary materials for the bottom resist layer include carbon backbone polymers. The bottom resist layer 92, 102 is used to planarize the structure, as the underlying structure may be uneven depending on the structure of the devices 14 formed on the substrate 12. In some embodiments, the bottom resist layer is formed by a spin coating process. In other embodiments, the bottom resist layer is formed by another suitable deposition process.

The middle resist layer 94, 104 of the trilayer resist may have a composition that provides anti-reflective properties and/or hard mask properties for the photolithography process. In some embodiments, the middle resist layer 94, 104 includes a silicon containing layer (e.g., a silicon hard mask material). The middle resist layer 94, 104 may include a silicon-containing inorganic polymer. In other embodiments, the middle resist layer 94, 104 includes a siloxane polymer. In other embodiments, the middle resist layer 94, 104 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle resist layer 94, 104 may be bonded to adjacent layers, such as by covalent bonding, hydrogen bonding, or hydrophilic-to-hydrophilic forces.

Thus, the middle resist layer 94, 104 may include a composition that allows for a covalent bond to be formed between the middle resist layer and the overlying photoresist 96, 106 after an exposure process and/or subsequent baking process. In some embodiments, the middle resist layer 94, 104 includes an additive compound or component having a photo base generator (PBG). This PBG generates a base that interacts with the exposed photoresist and provides for covalent bonding between the middle layer and a component of the overlying photoresist. In some embodiments, the middle resist layer 94, 104 comprises a siloxane polymer and a PBG.

Exemplary photo-base generators include components that generate amines and sulfur (sulfur ions S—) bases. Other PBGs include carbamates, O-acyloximes, ammonium salts, amineimides, α-aminoketones, amidine precursors, aromatic ureas, and trimethylbenzhydrylammonium iodide.

The middle resist layer 94, 104 may be formed by a spin-on coating process, chemical vapor deposition process (CVD), physical vapor deposition (PVD) process, and/or other suitable deposition processes.

The photoresist upper layer 96, 106 of the trilayer resist 90, 100 may be a photosensitive layer which can be patterned by actinic radiation, as known in the art. Typically, the chemical properties of the photoresist regions struck by incident radiation change in a manner that depends on the type of photoresist used. In some embodiments, the photoresist upper layer 96, 106 is a positive resist. Positive resist refers to a photoresist material that when exposed to radiation (typically UV light) becomes soluble in a developer, while the portion of the photoresist that is non-exposed (or exposed less) is insoluble in the developer. In other embodiments, the photoresist upper layer 96, 106 is a negative resist. Negative resist refers a photoresist material that when exposed to radiation becomes insoluble in the developer, while the portion of the photoresist that is non-exposed is soluble in the developer.

The photoresist upper layer 96, 106 may include a carbon backbone polymer, and other suitable components such as a solvent and/or photo acid generators. For example, in some embodiments, the photoresist upper layer 96, 106 is a known chemical amplified resist.

In some embodiments, after deposition, a soft bake process is performed on the photoresist upper layer 96, 106. The photoresist upper layer 96, 106 is subsequently exposed to actinic radiation in a patternwise manner thereby forming a latent image in the photoresist upper layer 96, 106. The actinic radiation may be generated by a lithography system that provides a pattern of the radiation according to an integrated circuit design layout. In some embodiments, a lithography system includes ultraviolet (UV) radiation, deep ultraviolet (DUV) radiation, extreme ultraviolet (EUV) radiation, X-ray radiation, and/or other suitable radiation types. In alternative embodiments, a lithography system includes a charged particle lithography system, such as an electron beam or an ion beam lithography system.

In some embodiments, after the exposure operation, a hard baking operation occurs. The exposed photoresist upper layer 96, 106 is subsequently developed to form a pattern, as depicted in FIGS. 3 and 7, by applying a developer to the exposed photoresist upper layer 96, 106. The developer is a solvent, and may be sprayed on the exposed photoresist film.

In some embodiments, the first and second via openings 118, 128 are formed simultaneously, using one series of photolithographic patterning and etching operations, rather than using two series of photolithographic patterning and etching operations. The pattern pitch and resolution of the photolithographic techniques determine whether one series of patterning and etching operations are suitable. Multiple series of patterning and etching operations are suitable for smaller pattern pitches or lower resolution photolithographic techniques.

Figure 11:
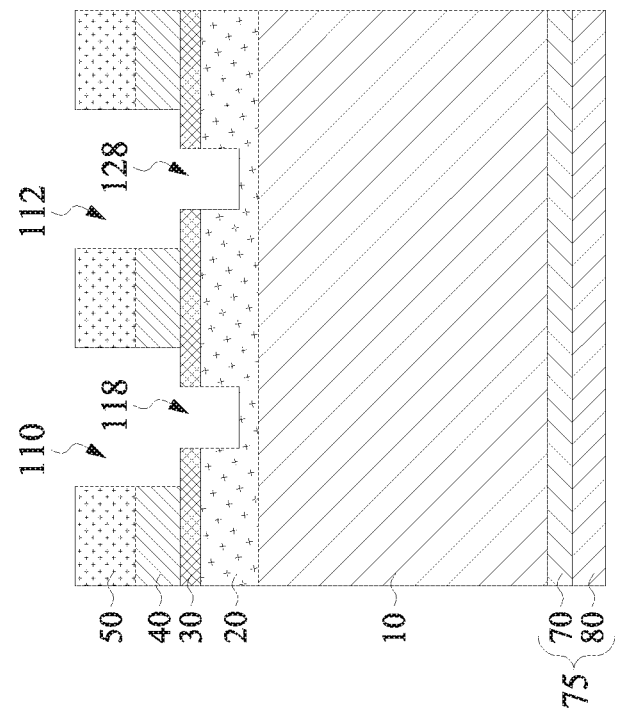

As shown in FIG. 11, the optional third dielectric layer 60 is removed. The third dielectric layer 60 can be removed by dry etching techniques. For example, in certain embodiments, $CH_xF_y$ or $CF_x$-based plasma etching is used to remove the third dielectric layer 60. In some embodiments, the exposed first dielectric layer 20 is etched during the third dielectric layer 60 removal operation, thereby extending the first via opening 118 and second via opening 128 into the first dielectric layer 20.

Figure 12:
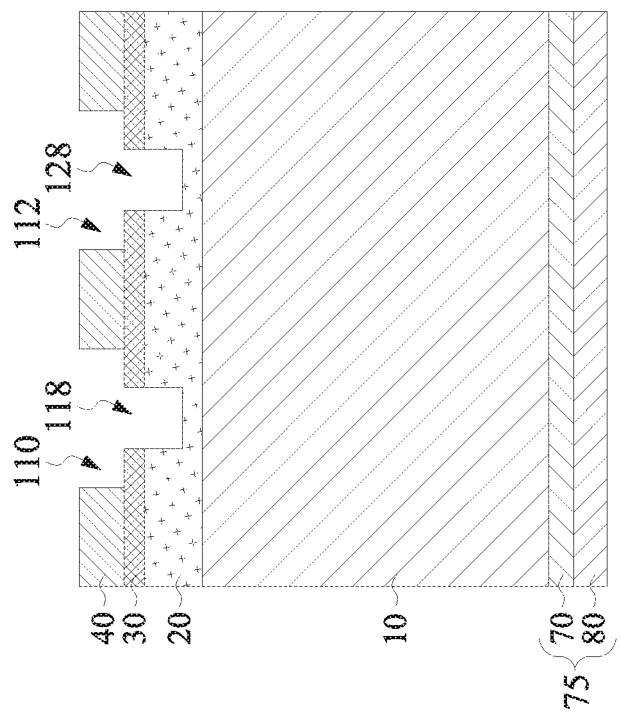

The second metal hard mask layer 50 is removed by a suitable etching operation, such as a plasma dry etch using $Cl_2$ or $BCl_3$-based chemistries, in some embodiments, as shown in FIG. 12.

If the optional third dielectric layer 60 is not formed, the first dielectric layer 20 is etched by using the second metal hard mask layer 50 as an etching mask, and then the second metal hard mask layer 50 is subsequently removed.

Figure 13:
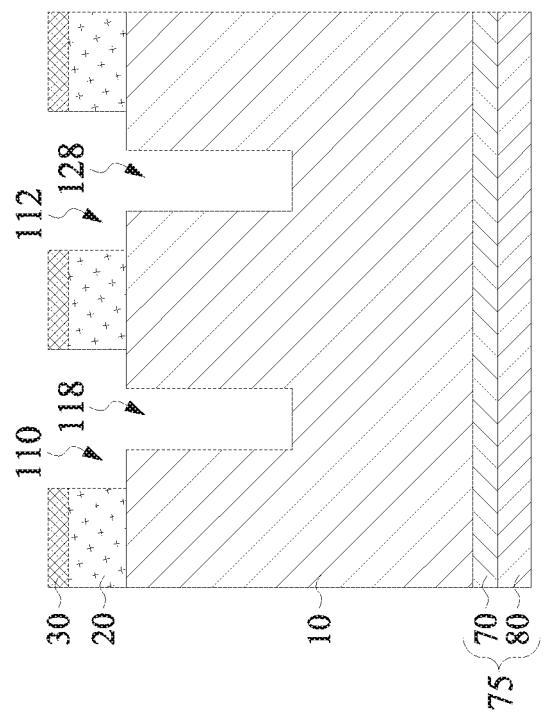

As shown in FIG. 13, the second dielectric layer 40 is removed by anisotropic dry etching, in some embodiments. $CH_xF_y$ or $CF_x$-based plasma etching can be used to remove the second dielectric layer 40. During the anisotropic etching, the exposed portions of the first dielectric layer 20, are also etched, thereby extending the first and second trench openings 110, 112. In addition, the first and second via openings 118, 128 are extended into the IMD layer 10 by the anisotropic etching.

Figure 14:
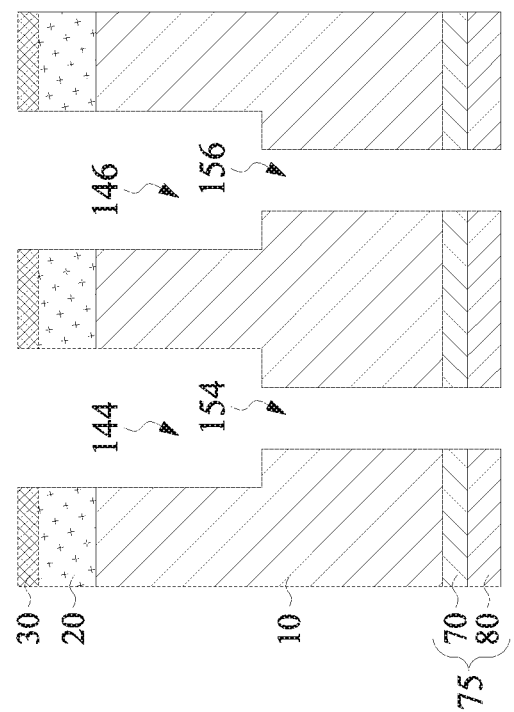
Figure 17:
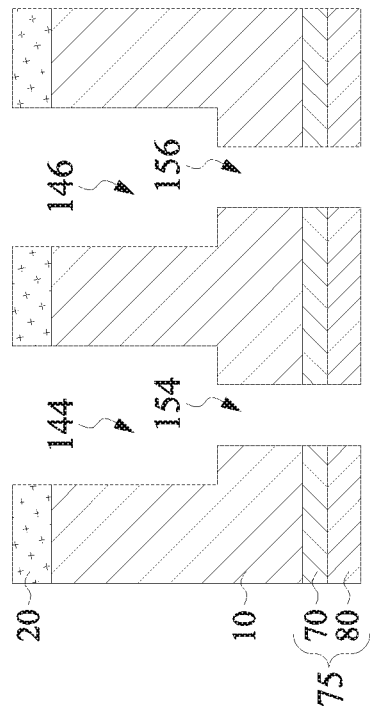

As shown in FIG. 14, the anisotropic etching is continued in some embodiments by using the first metal hard mask layer 30 as an etching mask to extend the first and second trench openings 110, 112 into the IMD layer 10 to form a first trench 144 and a second trench 146. In addition, anisotropic etching is continued in some embodiments to extend the first and second via openings 118, 128 through the etch stop layer 75 to form a first via 154 and a second via 156. In certain embodiments where anisotropic etching is used to etch through both the first etch stop layer 70 and the second etch stop layer 80, both the first etch stop layer 70 and the second etch stop layer 80 include a dielectric material, such as $SiC_xN_y$ and $SiC_xO_y$.

The trench/via structure is a dual damascene structure used to define a contact region in some embodiments. Although the embodiments illustrate the formation of dual damascene opening in the IMD layer 10, the method disclosed in the present disclosure is applicable for an embodiment having single damascene openings in the IMD layer. In dual damascene techniques including a "via-first" patterning method or a "trench-first" (see FIGS. 2-14) patterning method, the upper trenches and the vias may be formed using suitable photolithographic, masking, and etching etch operations (e.g. plasma etching or reactive ion etching).

Figure 15:
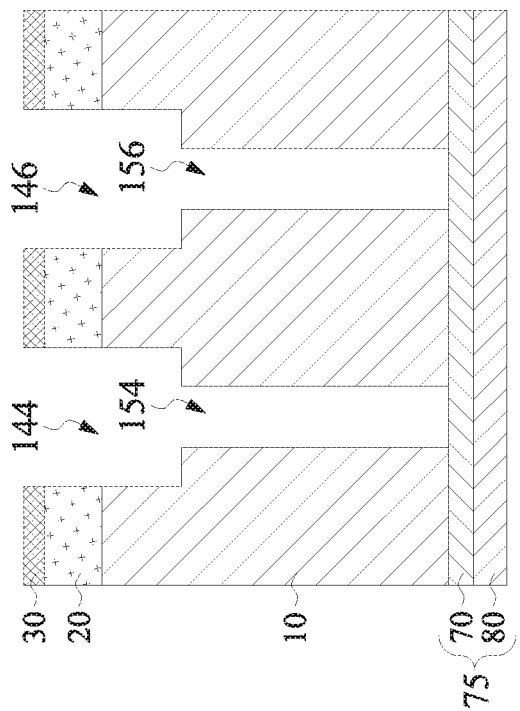
FIGS. 15-17 show an exemplary process for manufacturing a semiconductor device according to another embodiment of the present disclosure.
Figure 16:
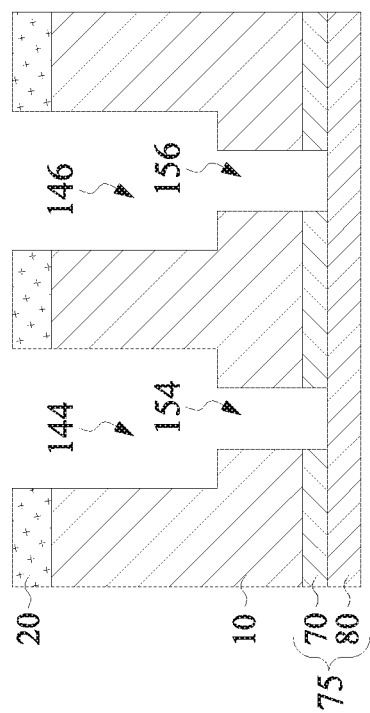

In some embodiments, dry etching operations are performed to extend the trench openings 110, 112 and via openings 118, 128 into the IMD layer 10, and through the etch stop layer 75, as shown in FIGS. 12-14, while in other embodiments, a combination of dry etching and wet etching operations is performed to extend the openings into the etch stop layer and remove the first metal hard mask layer 30. As shown in FIG. 15, anisotropic dry etching is used to extend the trench openings 110, 112 and via openings 118, 128 into the IMD layer 10 to form first and second trenches 144, 146 and first and second vias 154, 156. After the anisotropic dry etching operation, a wet etching operation is performed to remove the first metal hard mask layer 30 and the exposed portion of the first etch stop layer 70, thereby extending the first and second vias 154, 156, as shown in FIG. 16. An anisotropic dry etch is subsequently performed to remove the exposed second etch stop layer 80 thereby extending the first and second vias 154, 156 through the etch stop layer 75. In certain embodiments where a combination of wet etching and anisotropic etching are used to etch through the first etch stop layer 70 and the second etch stop layer 80, the first etch stop layer 70 includes a metal nitride, metal oxide, or metal oxynitride; and the second etch stop layer 80 include a dielectric material, such as $SiO_x$, $SiN_x$, $SiC_xN_y$ or $SiC_xO_y$. In another embodiment where a combination of wet etching and anisotropic etching are used to etch through the etch stop layer 75, the etch stop layer 75 includes a first etch stop layer 70 including a metal nitride, metal oxide, or metal oxynitride; a second etch stop layer 80 including a dielectric material, such as $SiO_x$, $SiN_x$, $SiC_xN_y$ or $SiC_xO_y$; and a third etch stop layer 170 including $SiC_xO_y$ or $SiO_x$ disposed over the first etch stop layer 70.

In some embodiments where a combination of wet etching and anisotropic etching are used to etch the etch stop layer 75, the first etch stop layer 70 contains $AlO_x$, where $0.5<x<0.7$; and the second etch stop layer 80 contains $SiC_xN_y$. The IMD 10 is a UV-cured porous low-k layer, where k ranges from about 2.3 to about 2.7. The double hard mask structure 202 further contains $SiO_x$, where $1<x<2$, as the first dielectric layer 20, and SiOH:C as the second dielectric layer 40 and the third dielectric layer 60. The first metal hard mask 30 in these embodiments contains where $1<x<2$, and the second metal hard mask 50 contains $TiN_x$, where $0.4<x<1$. In some embodiments, the first etch stop layer 70 contains $AlN_x$ or $AlO_xN_y$, or multiple layers including a layer of $SiC_xO_y$ or $SiO_x$. In certain embodiments, the IMD 10 is a dense low-k layer.

Figure 19:
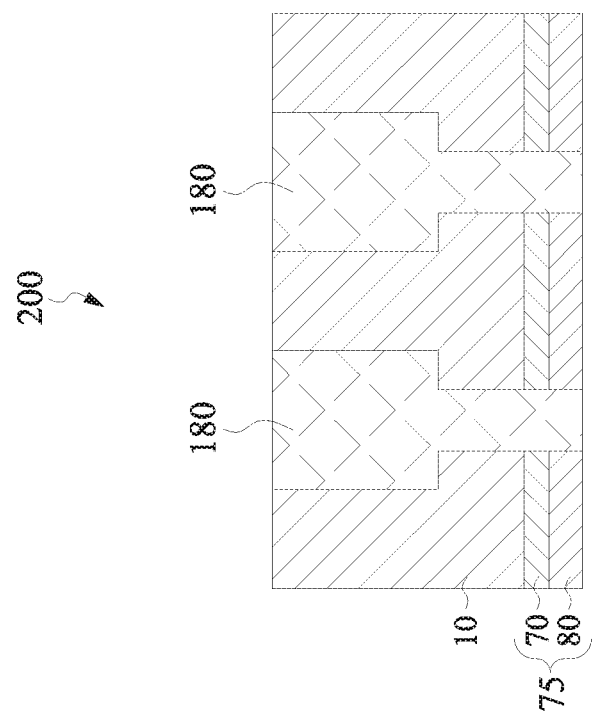
FIGS. 18-19 show an exemplary process for forming an interconnect according to an embodiment of the present disclosure.
Figure 18:
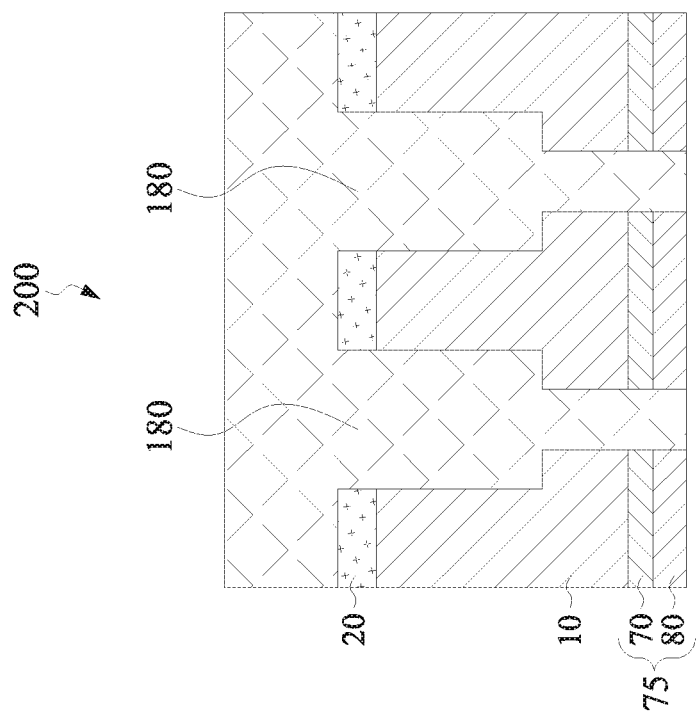

In certain embodiments, a conductive material is deposited in the first and second trenches 144, 146 and first and second vias 154, 156 to form an electrically conductive interconnect 180, as shown in FIG. 18. In some embodiments, a chemical mechanical polishing operation is subsequently performed to form the interconnect 180, as shown in FIG. 19, wherein the remaining first dielectric layer 20 is also removed by the chemical mechanical polishing operation. The conductive material may be a metal deposited using conventional techniques including PVD, ALD, and electroplating. In certain embodiments, barrier layers and metal seed layers are deposited in the trenches and vias, in addition to the interconnect conductive material. In certain embodiments, the interconnect conductive material includes aluminum, copper, and tungsten.

It is understood that additional operations can be provided before, during, and after the operations shown by FIGS. 1-18, and some of the operations described below can be replaced or eliminated, for additional embodiments of the method. The order of the operations/processes may be interchangeable.

The present disclosure prevents damage to the inter-metal dielectric (IMD) layer by use of the double metal hard mask. The lower metal hard mask layer and lower dielectric layer protects the IMD layer from exposure to wet chemicals while the trench openings and via openings are being formed in the double metal hard mask. Further, the double metal hard mask of the present disclosure provides improved etch selectivity.

While multiple patterning steps may be used during the formation of multiple trench and via openings, extending the trench and via openings into the IMD layer to form trenches and vias can be performed by a single IMD dry etch, thereby limiting the IMD exposure to etching operations and possible damage from multiple exposures to etching operations. In addition, the double metal hard mask allows the upper metal hard mask, i.e., the second metal hard mask, to be removed using a dry etch operation without exposing the IMD layer to the removal chemicals, thereby minimizing solvent uptake by and subsequent damage to the IMD layer. Furthermore, the double metal hard mask prevents ash generated from a resist ashing operation from damaging the IMD layer.

It is understood that not all advantages have been necessarily discussed herein, no particular advantage is required for all embodiments, and other embodiments may offer different advantages.

According to an embodiment of the present disclosure, a method of forming a semiconductor device includes forming a low-k dielectric layer over a substrate and forming a first dielectric layer on the low-k dielectric layer. A first metal hard mask layer is formed on the first dielectric layer, and a second dielectric layer is formed on the first metal hard mask layer. A second metal hard mask layer is formed on the second dielectric layer, and a first trench opening is formed in the second metal hard mask layer and the second dielectric layer exposing the first metal hard mask layer. A first via opening is formed in the exposed first metal hard mask layer in the first trench opening, and the first trench opening and first via opening are extended into the low-k dielectric layer to form a first trench and a first via.

According to another embodiment of the present disclosure, a method of forming a semiconductor device includes forming an etch stop layer over a substrate and forming a low-k dielectric layer on the etch stop layer. A first dielectric layer is formed on the low-k dielectric layer, and a first metal hard mask layer is formed on the first dielectric layer. A second dielectric layer is formed on the first metal hard mask layer, and a second metal hard mask layer on the second dielectric layer. A third dielectric layer is formed on the second metal hard mask layer. A first trench opening and a second trench opening are formed in the first dielectric layer, second metal hard mask layer, and the first dielectric layer exposing the first metal hard mask layer. A first via opening is formed in the first trench opening extending through the first metal hard mask layer. A second via opening is formed in the second trench opening extending through the first metal hard mask layer. The third dielectric layer and a portion of the first dielectric layer in the first via opening and the second via opening are removed to extend the first and second via openings into the first dielectric layer. The second metal hard mask layer is removed, and the first and second trench openings are extended into the low-k dielectric layer and the first and second via openings are extended into the etch stop layer to form first and second trenches and first and second vias.

According to another embodiment of the present disclosure, a method of forming a semiconductor device includes forming a first etch stop layer over a substrate, and forming a low-k dielectric layer on the first etch stop layer. A first dielectric layer is formed on the low-k dielectric layer, and a first metal hard mask layer is formed on the first dielectric layer. A second dielectric layer is formed on the first metal hard mask layer, and a second metal hard mask layer is formed on the second dielectric layer. A third dielectric layer is formed on the second metal hard mask layer. A first trench opening and a second trench opening are formed in the first dielectric layer, second metal hard mask layer, and the second dielectric layer exposing the first metal hard mask layer. A first resist layer is formed over the third dielectric layer, second metal hard mask layer, and the first and second trench openings. A first resist opening is formed in the first resist layer exposing the first metal hard mask layer in the first trench opening. The first metal hard mask layer is removed in the first resist opening to form a first via opening, and the first resist layer is removed. A second resist layer is formed over the third dielectric layer, second metal hard mask layer, and the first and second trench openings. A second resist opening is formed in the second resist layer exposing the first metal hard mask layer in the second trench opening. The first metal hard mask layer is removed in the second resist opening to form a second via opening, and the second resist layer is removed. The third dielectric layer is removed, and a portion of the first dielectric layer in the first via opening and the second via opening is removed to extend the first and second via openings into the first dielectric layer. The second metal hard mask layer is removed, and the second dielectric layer is removed, extending the first and second trench openings into the first dielectric layer, and extending the first and second via openings into the low-k dielectric layer. The first and second trench openings are extended into the low-k dielectric layer and the first and second via openings are extended into the first etch stop layer to form first and second trenches and first and second vias.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device comprising:
   forming a low-k dielectric layer over a substrate;
   forming a first metal hard mask layer over the low-k dielectric layer;
   forming a second metal hard mask layer over the first metal hard mask layer, wherein the second metal hard mask layer is formed of a different material than the first metal hard mask layer;
forming a first trench opening in the second metal hard mask layer exposing the first metal hard mask layer;
forming a first via opening in the exposed first metal hard mask layer in the first trench opening; and
extending the first trench opening and first via opening into the low-k dielectric layer to form a first trench and a first via.

2. The method according to claim 1, wherein a first etch stop layer is located between the low-k dielectric layer and the substrate, further comprising extending the first via through the first etch stop layer.

3. The method according to claim 2, wherein a second etch stop layer is located between the first etch stop layer and the substrate, further comprising extending the first via through the second etch stop layer.

4. The method according to claim 3, further comprising depositing a conductive material in the first trench and the first via.

5. The method according to claim 1, further comprising:
forming a second trench opening in the second metal hard mask layer exposing the first metal hard mask layer;
forming a second via opening in the exposed first metal hard mask layer in the second trench opening; and
extending the second trench opening and second via opening into the low-k dielectric layer to form a second trench and a second via.

6. The method according to claim 5, wherein a first etch stop layer is located between the low-k dielectric layer and the substrate, further comprising extending the second via through the first etch stop layer.

7. The method according to claim 6, wherein a second etch stop layer is located between the first etch stop layer and the substrate, further comprising extending the second via through the second etch stop layer.

8. The method according to claim 7, further comprising depositing a conductive material in the second trench and the second via.

9. The method according to claim 1, wherein the first and second metal hard mask layers comprise a metal, metal nitride, or metal oxide.

10. The method according to claim 1, wherein the low-k dielectric layer is formed from an alkoxysilane-based precursor material.

11. The method according to claim 1, further comprising forming a trilayer resist over the second metal hard mask after forming the first trench opening and before forming the first via opening.

12. A method of forming a semiconductor device comprising:
forming a plurality of alternating first dielectric layers and second dielectric layers over a substrate;
forming a first metal hard mask layer on the first dielectric layer;
forming a third dielectric layer on the first metal hard mask layer;
forming a second metal hard mask layer on the third dielectric layer;
forming a first trench opening in the second metal hard mask layer and the third dielectric layer exposing the first metal hard mask layer;
forming a first via opening in the exposed first metal hard mask layer in the first trench opening; and
extending the first trench opening and first via opening into the plurality of alternating first dielectric layers and second dielectric layers to form a first trench and a first via.

13. The method according to claim 12, wherein a first etch stop layer is located between the plurality of alternating first dielectric layers and second dielectric layers and the substrate, further comprising extending the first via through the first etch stop layer.

14. The method according to claim 13, further comprising depositing a conductive material in the first trench and the first via.

15. The method according to claim 12, further comprising:
forming a second trench opening in the second metal hard mask layer exposing the first metal hard mask layer;
forming a second via opening in the exposed first metal hard mask layer in the second trench opening; and
extending the second trench opening and second via opening into the plurality of alternating first dielectric layers and second dielectric layers to form a second trench and a second via.

16. The method according to claim 12, wherein the first dielectric layer includes $Ti_xSi_yO$, where $x/y<1$ and the second dielectric includes where $1 \leq x \leq 2$.

17. A method of forming a semiconductor device comprising:
forming a first etch stop layer over a substrate;
forming a second etch stop layer over the first etch stop layer;
forming a third etch stop layer over the second etch stop layer,
wherein the first etch stop layer, second etch stop layer, and the third etch stop layer are formed of different materials;
forming a low-k dielectric layer over the third etch stop layer;
forming a first metal hard mask layer on the low-k dielectric layer;
forming a second dielectric layer on the first metal hard mask layer;
forming a second metal hard mask layer on the second dielectric layer;
forming a first trench opening in the second metal hard mask layer and the second dielectric layer exposing the first metal hard mask layer;
forming a first via opening in the exposed first metal hard mask layer in the first trench opening; and
extending the first trench opening and first via opening into the low-k dielectric layer to form a first trench and a first via.

18. The method according to claim 17, further comprising depositing a conductive material in the first trench and the first via.

19. The method according to claim 17, further comprising:
forming a second trench opening in the second metal hard mask layer exposing the first metal hard mask layer;
forming a second via opening in the exposed first metal hard mask layer in the second trench opening; and
extending the second trench opening and second via opening into the low-k dielectric layer to form a second trench and a second via.

20. The method according to claim 17, wherein the low-k dielectric layer is formed from an alkoxysilane-based precursor material.

* * * * *